United States Patent
Sumita et al.

(10) Patent No.: US 9,711,378 B2
(45) Date of Patent: Jul. 18, 2017

(54) LIQUID EPOXY RESIN COMPOSITION FOR SEMICONDUCTOR SEALING AND RESIN-SEALED SEMICONDUCTOR DEVICE

(71) Applicant: SHIN-ETSU CHEMICAL CO., LTD., Tokyo (JP)

(72) Inventors: Kazuaki Sumita, Annaka (JP); Tatsuya Uehara, Annaka (JP); Naoyuki Kushihara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/103,371

(22) PCT Filed: Nov. 28, 2014

(86) PCT No.: PCT/JP2014/081557
§ 371 (c)(1),
(2) Date: Jun. 10, 2016

(87) PCT Pub. No.: WO2015/104917
PCT Pub. Date: Jul. 16, 2015

(65) Prior Publication Data
US 2016/0314992 A1 Oct. 27, 2016

(30) Foreign Application Priority Data
Jan. 8, 2014 (JP) .................................. 2014-001724

(51) Int. Cl.
| | |
|---|---|
| H01L 21/00 | (2006.01) |
| H01L 21/56 | (2006.01) |
| C08G 59/42 | (2006.01) |
| C08K 9/06 | (2006.01) |
| H01L 23/29 | (2006.01) |
| C09D 7/12 | (2006.01) |
| C09D 163/00 | (2006.01) |
| H01L 21/78 | (2006.01) |
| C08G 59/24 | (2006.01) |
| C08G 59/32 | (2006.01) |
| C08G 59/68 | (2006.01) |
| C08K 5/09 | (2006.01) |

(52) U.S. Cl.
CPC .......... *H01L 21/561* (2013.01); *C08G 59/245* (2013.01); *C08G 59/3218* (2013.01); *C08G 59/3227* (2013.01); *C08G 59/3281* (2013.01); *C08G 59/42* (2013.01); *C08G 59/686* (2013.01); *C08K 9/06* (2013.01); *C09D 7/1225* (2013.01); *C09D 7/1233* (2013.01); *C09D 163/00* (2013.01); *H01L 21/78* (2013.01); *H01L 23/296* (2013.01); *C08K 5/09* (2013.01); *C08K 2201/003* (2013.01); *H01L 2924/0002* (2013.01)

(58) Field of Classification Search
CPC ....... H01L 21/561; C08G 59/42; C08G 59/50; C08G 59/245; C08G 59/3281; C08G 59/3227; C08G 59/3218; C08G 59/686; C08K 3/22; C08K 3/0033
USPC ........................................................ 438/113
See application file for complete search history.

(56) References Cited

U.S. PATENT DOCUMENTS

| | | |
|---|---|---|
| 5,038,265 A | 8/1991 | Paladel |
| 2002/0045709 A1* | 4/2002 | Sumita ................... C08L 63/00 525/107 |
| 2011/0105646 A1 | 5/2011 | Kan et al. |
| 2012/0184646 A1 | 7/2012 | Sumita et al. |
| 2013/0032933 A1* | 2/2013 | Fuke ......................... C08K 3/22 257/676 |
| 2013/0271999 A1* | 10/2013 | Shiobara .................. F21V 7/22 362/341 |

FOREIGN PATENT DOCUMENTS

| | | |
|---|---|---|
| EP | 2 166 029 A1 | 3/2010 |
| JP | 61-221216 A | 10/1986 |
| JP | 3-119409 A | 5/1991 |
| JP | 5-320482 A | 12/1993 |
| JP | 5-331296 A | 12/1993 |
| JP | 2003-105168 A | 4/2003 |
| JP | 2004-059779 A | 2/2004 |
| JP | 2004-256810 A | 9/2004 |

(Continued)

OTHER PUBLICATIONS

International Search Report (PCT/ISA/210) issued in PCT/JP2014/081557, mailed on Mar. 3, 2015.

(Continued)

*Primary Examiner* — Brook Kebede
(74) *Attorney, Agent, or Firm* — Birch, Stewart, Kolasch & Birch, LLP

(57) ABSTRACT

The present invention relates to a liquid epoxy resin composition for semiconductor sealing, which contains: (A) a liquid epoxy resin that does not contain a siloxane bond in each molecule; (B) an acid anhydride-based curing agent; (C) a surface-treated spherical inorganic filler which is a spherical inorganic filler having an average particle diameter of 0.1-10 μm as determined by a laser diffraction method and serving as an inorganic filler, and wherein the surface of the spherical inorganic filler is surface-treated with 0.5-2.0 parts by weight of a (meth)acrylic functional silane coupling agent per 100 parts by weight of the spherical inorganic filler of the component (C); and (D) a curing accelerator. The present invention is able to provide a semiconductor device which has excellent heat resistance and moisture resistance.

10 Claims, 1 Drawing Sheet

(56) References Cited

FOREIGN PATENT DOCUMENTS

| | | |
|---|---|---|
| JP | 2005-298740 A | 10/2005 |
| JP | 2008-266512 A | 11/2008 |
| JP | 2012-149111 A | 8/2012 |
| WO | WO 2009/142065 A1 | 11/2009 |
| WO | WO 2012/165239 A1 | 12/2012 |

OTHER PUBLICATIONS

Written Opinion (PCT/ISA/237) issued in PCT/JP2014/081557, mailed on Mar. 3, 2015.
European Search Report for Appl. No. 14878027.3 dated May 10, 2017.

* cited by examiner

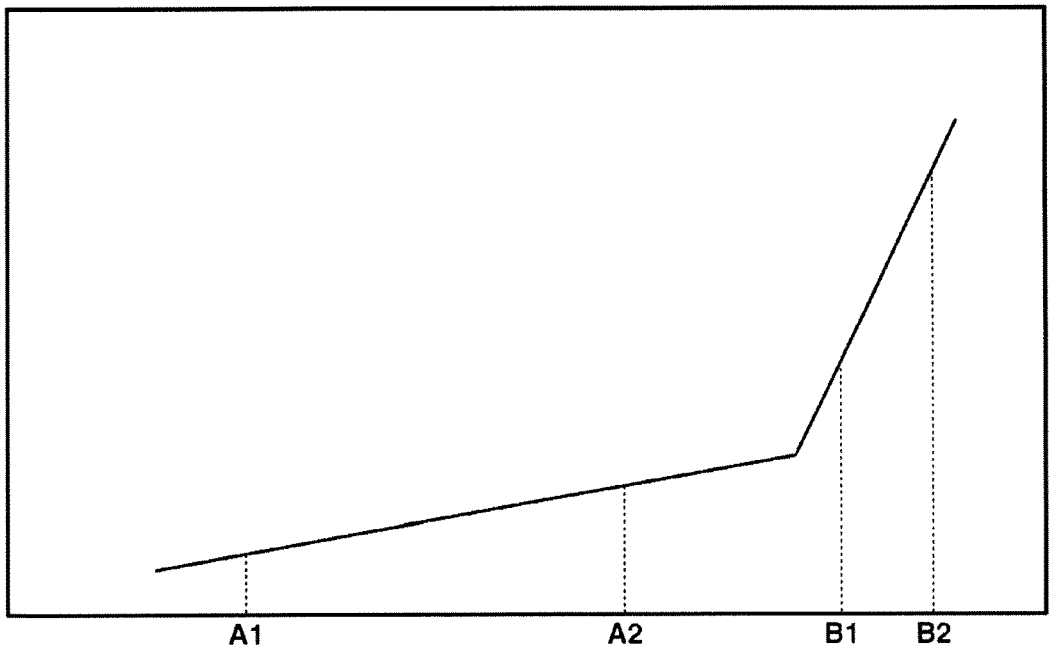

LIQUID EPOXY RESIN COMPOSITION FOR SEMICONDUCTOR SEALING AND RESIN-SEALED SEMICONDUCTOR DEVICE

TECHNICAL FIELD

The present invention relates to a liquid epoxy resin composition for semiconductor sealing, a semiconductor device sealed with a cured product of the resin composition, and a method of producing a resin-sealed semiconductor device.

BACKGROUND ART

In recent years, semiconductor devices have been meeting a remarkable technological innovation.

In mobile information and telecommunication terminals such as smartphones and tablet computers, in order to enable high-speed processing of large volumes of information, semiconductor elements are multilayer connected by use of TSV (through-silicon via) technology, then flip chip bonded to an 8- to 12-inch silicon interposer, and sealed by a thermosetting resin together with the interposer on which the plurality of multilayer connected semiconductor elements are mounted. After polishing the unrequired cured resin on the semiconductor elements, division into individual chips is conducted, whereby a semiconductor device which is thin, small-sized, multifunctional and capable of high-speed processing can be obtained.

In the cases where such substrates as small-diameter wafers of approximately 8 inches are used, sealing and molding can be performed without serious problems. Where the diameter is at least 12 inches, however, the compressive stress of the epoxy resin or the like after sealing is so high as to bring about such a problem as peeling of the semiconductor element from the substrate made of metal or the like, which hampers transition to mass production. In order to solve the above-mentioned problem brought about attendant on the increase in diameter of the wafer and the metal substrate, it has been necessary to reduce the compressive stress at the time of curing by loading with at least 90% by weight of filler or by lowering the elasticity of the resin.

Where a silicon interposer is entirely sealed from above with a thermosetting resin, however, large warpage occurs due to a difference between silicon and the thermosetting resin in coefficient of thermal expansion. The large warpage makes it impossible to apply the intermediate product to the subsequent polishing step or individualizing step. This is a serious technical problem.

Further, in recent years, attendant on the trend toward multilayer stacking of semiconductor elements, the sealing layer has increased in thickness, so that semiconductor devices accompanied by thinning through polishing of the resin layer used for sealing have come to be the mainstream. When a sealing or encapsulating material of a filler loading of at least 90% by weight is used, a blade of a dicing apparatus is liable to be damaged at the time of polishing the resin layer used for sealing; as a result, the frequency of replacement of the blade is high, which causes a rise in cost. In addition, since polishing must be conducted at an enhanced polishing pressure, such problems as damaging of the semiconductor elements or cracking of the wafer itself have been occurring. On the other hand, where a low-elasticity resin material represented by conventional silicone compounds is used, such problems as clogging with the resin or cracking of the resin have been occurring at the time of polishing, due to the softness of the resin.

Note that examples of the background art related to the present invention include the following.

PRIOR ART DOCUMENTS

Patent Documents

Patent Document 1: JP-A 2008-266512
Patent Document 2: WO 2009/142065
Patent Document 3: JP-A 2012-149111

SUMMARY OF THE INVENTION

Problems to be Solved by the Invention

The present invention has been made in consideration of the above-mentioned circumstances. It is an object of the present invention to provide a liquid epoxy resin composition for semiconductor sealing which is excellent in fluidity, shows reduced warpage upon curing and gives a highly reliable cured product, a semiconductor device sealed with the cured product, and a method of producing a resin-sealed semiconductor device.

Means for Solving the Problems

The present inventors made extensive and intensive investigations for achieving the above object. As a result of their investigations, they found out that a liquid epoxy resin composition using a spherical inorganic filler surface-treated with a specific filler surface-treating material, when used to seal a semiconductor device, shows good water resistance and polishability. In addition, the liquid epoxy resin composition was found, even when used for sealing of semiconductor devices while using a large-type wafer, to show excellent fluidity and produce reduced warpage, and to be therefore highly versatile at any time. On the basis of the findings, the present inventors have completed the present invention.

Accordingly, the present invention provides a liquid epoxy resin composition for semiconductor sealing, a semiconductor device, and a method of producing a resin-sealed semiconductor device described below.

[1]

A liquid epoxy resin composition for semiconductor sealing, including:

(A) a liquid epoxy resin that does not include a siloxane bond in its molecule;

(B) an acid anhydride curing agent;

(C) a surface-treated spherical inorganic filler which is a spherical inorganic filler having an average particle diameter of 0.1 to 10 μm as measured by a laser diffraction method and serving as an inorganic filler, the surface of the spherical inorganic filler being surface-treated with 0.5 to 2.0 parts by weight of a (meth)acrylic functional silane coupling agent represented by the following formula (1) based on 100 parts by weight of the spherical inorganic filler of component (C), the amount of component (C) being 600 to 1,000 parts by weight based on 100 parts by weight in total of components (A) and (B):

[Chemical Formula 1]

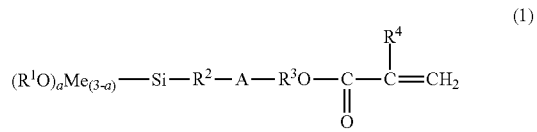

In the formula, letter a is an integer of 0 to 3, $R^1$ is a monovalent saturated hydrocarbon group having 1 to 4 carbon atoms, $R^2$ is a divalent saturated hydrocarbon group having 1 to 10 carbon atoms, $R^3$ is a single bond or a divalent saturated hydrocarbon group having 1 to 10 carbon atoms, $R^4$ is a hydrogen atom or a methyl group, A is a single bond or any one of groups represented by the following formulas:

[Chemical Formula 2]

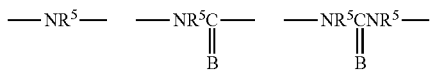

(In the formulas, $R^5$ is a monovalent saturated hydrocarbon group having 1 to 4 carbon atoms, and B is O or S.)

[Chemical Formula 3]

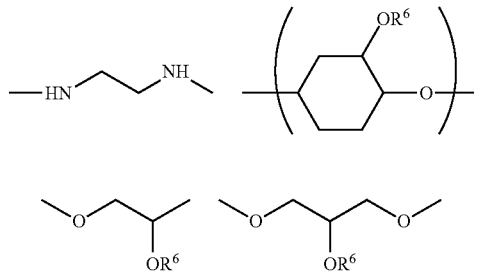

(In the formulas, $R^6$ is a monovalent saturated hydrocarbon group having 1 to 4 carbon atoms.); and (D) a curing accelerator.

[2]

The liquid epoxy resin composition of [1], wherein component (A) is at least one selected from a bisphenol A epoxy resin, a bisphenol F epoxy resin, a naphthalene epoxy resin, an alicyclic epoxy resin and epoxy resins represented by the following formulas.

[Chemical Formula 4]

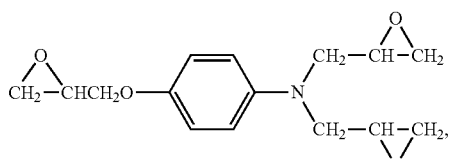

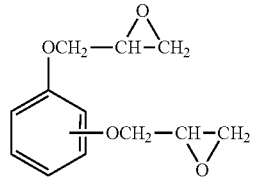

[3]

The liquid epoxy resin composition for semiconductor sealing of [1] or [2], wherein component (B) is at least one selected from acid anhydrides represented by the following formulas:

[Chemical Formula 5]

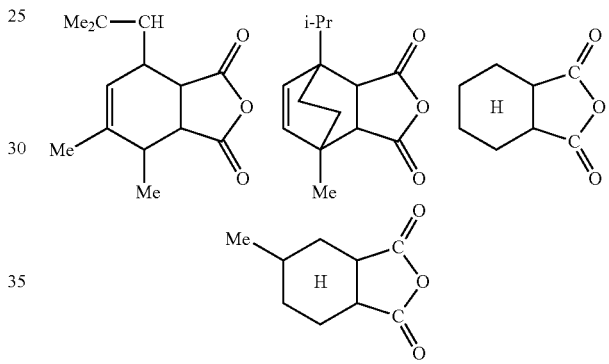

(In the formulas, Me represents a methyl group, and i-Pr represents an isopropyl group.).

[4]

The liquid epoxy resin composition of any one of [1] to [3], including a silicone-modified epoxy resin represented by the following average composition formula (2):

[Chemical Formula 6]

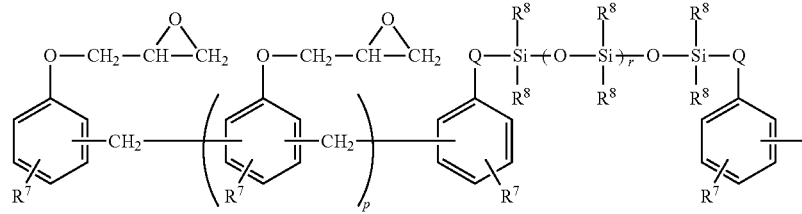
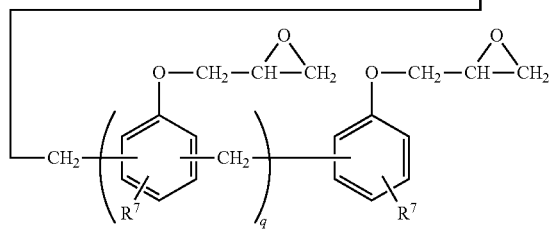

(2)

(In the formula, $R^7$ is a hydrogen atom or an alkyl group having 1 to 4 carbon atoms, $R^8$ is an alkyl group having 1 to 4 carbon atoms, Q is an alkylene group, oxyalkylene group or hydroxyoxyalkylene group having 3 to 6 carbon atoms, letter r is an integer of 4 to 199, letter p is an integer of 1 to 10, and letter q is an integer of 1 to 10.) in an amount of 1 to 50 parts by weight based on 100 parts by weight of component (A).

[5]

The liquid epoxy resin composition of any one of [1] to [4], wherein component (D) is at least one selected from a phosphorus compound, a tertiary amine compound and an imidazole compound, and the amount thereof is 0.1 to 15 parts by weight based on 100 parts by weight in total of components (A) and (B).

[6]

The liquid epoxy resin composition of [5], wherein component (D) is at least one selected from triphenylphosphine, tributylphosphine, tri(p-methylphenyl)phosphine, tri(nonylphenyl)phosphine, triphenylphosphine triphenylborane, tetraphenylphosphine tetraphenylborate, triethylamine, benzyldimethylamine, α-methylbenzyldimethylamine, 1,8-diazabicyclo[5.4.0]undecene-7,2-methylimidazole, 2-phenylimidazole and 2-phenyl-4-methylimidazole.

[7]

The liquid epoxy resin composition of any one of [1] to [6], having a viscosity at 25° C. of 5 to 1,000 Pa·s as measured by the method described in JIS K 7117-1.

[8]

A semiconductor device sealed with a cured product of the liquid epoxy resin composition of any one of [1] to [7].

[9]

A method of producing a resin-sealed semiconductor device, wherein in collectively sealing a whole body of a silicon wafer or substrate formed with at least one semiconductor element with a cured product of an epoxy resin composition for semiconductor sealing, one side of the silicon wafer or substrate formed with at least one semiconductor element is coated with the liquid epoxy resin composition for semiconductor sealing of any one of [1] to [7] under pressure or in a vacuum atmosphere under a reduced pressure, the resin composition is cured by heating to seal the semiconductor elements, thereafter a cured resin layer is polished, and the thus treated silicon wafer or substrate formed with at least one semiconductor element is subjected to dicing, to be divided into individual chips.

[10]

The method of producing a resin-sealed semiconductor device of [9], which is characterized by using a silicon wafer having a diameter of 12 to 20 inches.

Advantageous Effects of the Invention

According to the liquid epoxy resin composition for semiconductor sealing of the present invention, it is ensured that even when a semiconductor element array having at least one semiconductor element mounted on an inorganic substrate, metal substrate or organic substrate by an adhesive (die bonding agent) or a large-diameter silicon wafer formed with semiconductor elements is sealed, warpage hardly occurs upon cooling after curing by heating, and a semiconductor device excellent in heat resistance and humidity resistance can be provided. Moreover, collective sealing at a wafer level can be performed, and the sealing resin can be easily polished and diced.

BRIEF DESCRIPTION OF THE DRAWING

The drawing illustrates a method of determining a linear expansion coefficient of up to a glass transition temperature and a linear expansion coefficient of at least the glass transition temperature.

EMBODIMENT FOR CARRYING OUT THE INVENTION

The present invention is described more in detail below.

As (A) liquid epoxy resin for use in the composition of the present invention, there can be used any epoxy resin that is liquid at room temperature, examples of which include: bisphenol epoxy resins such as bisphenol A epoxy resins and bisphenol F epoxy resins; novolak epoxy resins such as phenol novolak epoxy resins and cresol novolak epoxy resins; naphthalene epoxy resins; biphenyl epoxy resins; cyclopentadiene epoxy resins, alicyclic epoxy resins and the like, and mixtures thereof.

Among the above liquid epoxy resins, particularly preferable are bisphenol A epoxy resins, bisphenol F epoxy resins, alicyclic epoxy resins and naphthalene epoxy resins, the viscosity (25° C.) of which, as measured by the method described in JIS K 7117-1, is preferably 0.1 to 500 Pa·s, more preferably 1 to 200 Pa·s.

In addition, epoxy resins represented by the following formulas may also be used preferably.

[Chemical Formula 7]

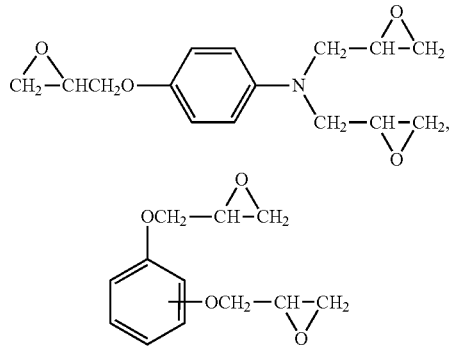

Note that in the cases where the epoxy resins having the above formulas are used, it is recommendable that the content of the epoxy resin is 25 to 100% by weight, more preferably 50 to 100% by weight, and further preferably 75 to 100% by weight based on the whole of component (A). If the content is less than 25% by weight, the viscosity of the composition may be raised, or the heat resistance of the cured product may be lowered.

The liquid epoxy resin of component (A) preferably has a hydrolysable chlorine content of up to 1,000 ppm, particularly up to 500 ppm, and a sodium content and a potassium content each of up to 10 ppm. In the case where the hydrolysable chlorine content exceeds 1,000 ppm or where the sodium content or the potassium content exceeds 10 ppm, the semiconductor device may be deteriorated in humidity resistance when left to stand in high-temperature and high-humidity conditions for a long time.

The curing agent of component (B) for use in the present invention is not particularly limited so long as it is an acid anhydride curing agent and is able to cure component (A). Preferably, the curing agent is one that is liquid or becomes liquid by dissolution in component (A) at room temperature. Examples of the preferable curing agent include 3,4-dimethyl-6-(2-methyl-1-propenyl)-1,2,3,6-tetrahydrophthalic anhydride, 1-isopropyl-4-methyl-bicyclo[2.2.2]octo-5-ene-2,3-dicarboxylic acid anhydride, methyltetrahydrophthalic anhydride, methylhexahydrophthalic anhydride, hexahydrophthalic anhydride, methylhimic anhydride, pyromellitic acid dianhydride, maleinized allo-ocimene, benzophenonetetracarboxylic acid dianhydride, 3,3',4,4'-biphenyltetrabis-benzophenonetetracarboxylic acid dianhydride, (3,4-dicarboxyphenyl)ether dianhydride, bis(3,4-dicarboxyphenyl) methane dianhydride, and 2,2-bis(3,4-dicarboxyphenyl) propane dianhydride. These compounds may be of a single kind used alone or may be of two or more kinds used in combination.

From the viewpoint of enhancing reliability, one of or a mixture of at least two of acid anhydrides represented by the following formulas are preferably used. In the following formulas, Me represents a methyl group, and Pr represents a propyl group.

[Chemical Formula 8]

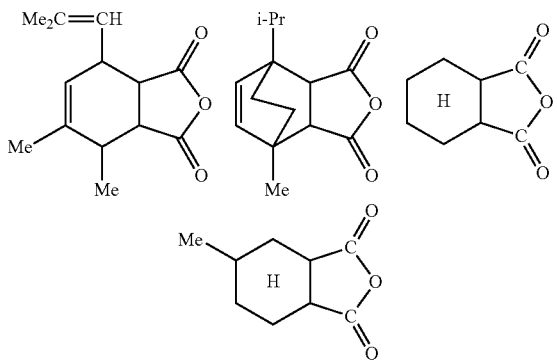

In the case where among the preferable acid anhydrides, a mixture of 3,4-dimethyl-6-(2-methyl-1-propenyl)-1,2,3,6-tetrahydrophthalic anhydride and 1-isopropyl-4-methyl-bicyclo[2.2.2]octo-5-ene-2,3-dicarboxylic acid anhydride is used, the amount of the mixture is desirably 5 to 75% by weight based on the whole of component (B). If the amount is less than 5% by weight, adhesion property is lowered and may result in deterioration under high-temperature and high-humidity conditions such as PCT. If the amount exceeds 75% by weight, adhesion property is enhanced but cracking may occur in tests such as a thermal shock test.

Examples of commercialized products of the above-mentioned mixture include YH306 and YH307 (commercial names) manufactured by Japan Epoxy Resins Co., Ltd., and MH700 (commercial name) manufactured by New Japan Chemical Co., Ltd.

In the case where component (B) contains the above mixture in an amount of 5 to 75% by weight, the remainder of the curing agent is not particularly limited, but is preferably one that is liquid or becomes liquid through dissolution in component (A) at room temperature, and examples thereof include the above-mentioned acid anhydrides. Particularly, it is preferable to use at least one selected from methyltetrahydrophthalic anhydride, methylhexahydrophthalic anhydride and hexahydrophthalic anhydride. It is noted that dicyandiamide or a carboxylic acid hydrazide such as adipic hydrazide and isophthalic hydrazide may be used together with the above acid anhydride.

The amount of component (B) is the effective amount for curing component (A), and varies depending on the kind of component (B). In the case of using the aforementioned acid anhydride as component (B), it is preferable to select the amount in such a manner that the equivalent ratio of the carboxylic acid group derived from the acid anhydride group (—CO—O—CO—) in the curing agent to the epoxy groups in the epoxy resin falls within the range of from 0.5 to 1.5. If the equivalent ratio is less than the lower limit, unreacted epoxy groups may be left, leading to a lowering in glass transition temperature, and adhesion property may be lowered. If the equivalent ratio exceeds the upper limit, the cured product would be hard and brittle, and cracking may occur at the time of reflow or a temperature cycle test.

The spherical inorganic filler of component (C) blended in the present invention may adopt the filler normally blended in epoxy resin compositions. Examples of the usable spherical inorganic filler include silicas such as fused silica and crystalline silica, alumina, silicon nitride, aluminum nitride, boron nitride, titanium oxide and glass fiber.

As for the average particle diameter and shape of the inorganic filler, the average particle diameter (cumulative weight average or median diameter) as measured by a laser diffraction method is 0.1 to 10 μm, and the inorganic filler is preferably spherical with an average particle diameter of 1 to 5 μm. Particularly preferred is fused silica having such an average particle diameter and shape.

The amount of component (C) is 600 to 1,000 parts by weight, preferably 700 to 900 parts by weight based on 100 parts by weight in total of components (A) and (B). If the amount is less than the lower limit, warping after molding would be large, and a sufficient strength may not be obtained. If the amount exceeds the upper limit, fluidity is conspicuously worsened, and it would be impossible to perfectly seal the semiconductor elements arrayed on a sub-mount.

Here, in order to ensure good compatibility between the epoxy resin and the inorganic filler and to enhance bonding strength, an inorganic filler preliminarily surface-treated with one kind or at least two kinds of silane coupling agents represented by the following formula (1) is used as the inorganic filler.

[Chemical Formula 9]

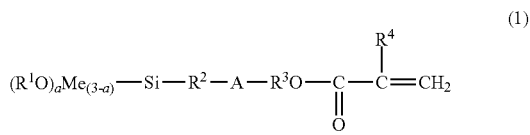

In the formula, letter a represents an integer of 0 to 3, $R^1$ represents a monovalent saturated hydrocarbon group having 1 to 4 carbon atoms, $R^2$ represents a divalent saturated hydrocarbon group having 1 to 10 carbon atoms, $R^3$ represents a single bond or a divalent saturated hydrocarbon group having 1 to 10 carbon atoms, and $R^4$ represents a hydrogen atom or a methyl group. In addition, A is a single bond or any one of groups represented by the following formulas:

[Chemical Formula 10]

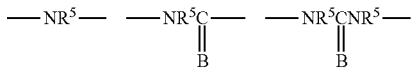

(In the formulas, $R^5$ is a monovalent saturated hydrocarbon group having 1 to 4 carbon atoms, and B is O or S.)

[Chemical Formula 11]

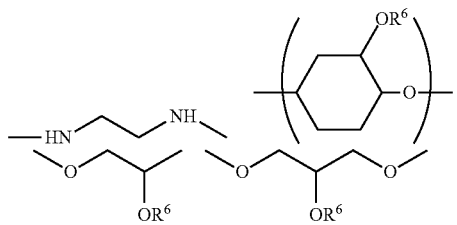

(In the formulas, $R^6$ is a monovalent saturated hydrocarbon group having 1 to 4 carbon atoms.)

In this case, letter a is preferably 0 to 3, more preferably 0 or 1. $R^1$ is preferably a methyl group or an ethyl group.

$R^2$ is preferably an alkylene group having 1 to 10 carbon atoms, particularly 1 to 3 carbon atoms, and $R^3$ is preferably a single bond or an alkylene group having 1 to 10 carbon atoms, particularly 1 or 2 carbon atoms.

A is as mentioned above, $R^5$ is preferably a methyl group or an ethyl group, and $R^6$ is preferably a methyl group or an ethyl group.

Examples of such a silane coupling agent include 3-methacryloxypropyltrimethoxysilane (KBM503, manufactured by Shin-Etsu Chemical Co., Ltd.) and 3-acryloxypropyltrimethoxysilane (KBM5103, manufactured by Shin-Etsu Chemical Co., Ltd.), as well as those which are represented by the following formula:

[Chemical Formula 12]

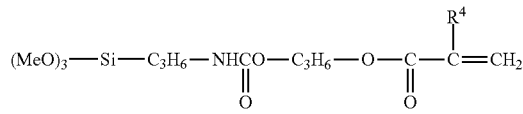

(In the formula, $R^4$ is as described above, and Me represents a methyl group.)

It is noted that the silane coupling agents are not limited to these illustrative examples.

While the method of surface treatment with the silane coupling agent used for surface treatment is not particularly limited, the amount of the silane coupling agent for the treatment is preferably 0.5 to 2.0 parts by weight, more preferably 0.5 to 1.5 parts by weight based on 100 parts by weight of the spherical inorganic filler of component (C) added to the thermosetting resin composition for semiconductor sealing.

Besides, in the present invention, the curing accelerator of component (D) is preferably the following. Phosphorus compounds such as triphenylphosphine, tributylphosphine, tri(p-methylphenyl)phosphine, tri(nonylphenyl)phosphine, triphenylphosphine triphenylborane, and tetraphenylphosphine tetraphenylborate, tertiary amine compounds such as triethylamine, benzyldimethylamine, α-methylbenzyldimethylamine, and 1,8-diazabicyclo[5.4.0]undecene-7, and imidazole compounds such as 2-methylimidazole, 2-phenylimidazole, and 2-phenyl-4-methylimidazole may be used.

The amount of the curing accelerator is an effective amount for accelerating the curing reaction of the epoxy resin and the curing agent, and is preferably 0.5 to 15 parts by weight, more preferably 0.5 to 10 parts by weight, based on 100 parts by weight in total of components (A) and (B).

In the liquid epoxy resin composition of the present invention, known silicone-modified epoxy resins, silicone rubbers, for the purpose of lowering stress in the cured product, silicone oils, silicone gels, liquid polybutadiene rubbers and flexible resins such as methyl methacrylate-butadiene-styrene may be blended in such amounts as not to be detrimental to the object of the present invention.

As the silicone-modified epoxy resin, the resins represented by the following formula (2) are preferable.

[Chemical Formula 13]

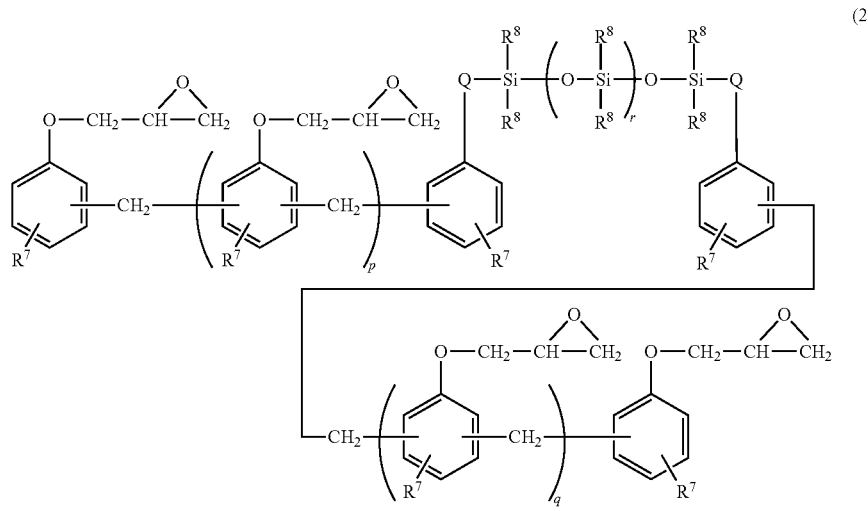

(2)

In the above formula, $R^7$ is a hydrogen atom or an alkyl group having 1 to 4 carbon atoms, preferably a hydrogen atom or a methyl group, $R^8$ is an alkyl group having 1 to 4 carbon atoms, preferably a methyl group. Q is an alkylene group, oxyalkylene group, or hydroxyoxyalkylene group having 3 to 6 carbon atoms, for example, —$CH_2CH_2CH_2$—, —$OCH_{12}$—$CH(OH)$—$CH_2$—$O$—$CH_2CH_2CH_2$— or —$O$—$CH_2CH_2CH_2$—. Letter r is an integer of 4 to 199, preferably 19 to 130, more preferably 70 to 109, letter p is an integer of 1 to 10, and letter q is an integer of 1 to 10, preferably an integer of 2 to 5.

In the case where the silicone-modified epoxy resin is blended, the blending amount may be 1 to 50 parts by weight based on 100 parts by weight of (A) epoxy resin; particularly, it is preferable to blend the silicone-modified epoxy resin in such an amount that diorganosiloxane units are contained in an amount of 1 to 20 parts by weight, particularly 2 to 15 parts by weight. As a result, stress in the cured product can be lowered, and properties for adhesion to the substrate can be enhanced. Here, the amount of the diorganopolysiloxane can be obtained by the following formula.

Amount of polysiloxane=

(Molecular weight of polysiloxane moiety/Molecular weight of silicone-modified epoxy resin)×addition amount In the sealing resin composition of the present invention, as needed, there can be further blended various additives such as release agent, flame retardant, ion trapping agent, antioxidant, adhesion imparting agent, stress reducing agent, and colorant.

The flame retardant is not particularly limited, and all the known ones can be used. Among the known flame retardants, phosphazene compounds, silicone compounds, talc with zinc molybdate supported thereon, zinc oxide with zinc molybdate supported thereon, aluminum hydroxide, magnesium hydroxide and molybdenum oxide are preferably used.

The ion trapping agent is not particularly restricted, and all the known ones can be used. Hydrotalcites, bismuth hydroxide compounds, rare earth oxides and the like are preferably used.

In the liquid epoxy resin composition for semiconductor sealing of the present invention, there can be further blended various additives as required. For instance, an organosilicon adhesiveness improver having an epoxy group such as 3-glycidoxypropyltrimethoxysilane, and a colorant such as various carbon blacks such as acetylene black or furnace black may be blended as additives insofar as the effects of the invention are attainable.

The composition of the present invention may be produced by a method as shown below. For example, the composition may be obtained by subjecting the epoxy resin, the curing agent and the curing accelerator to stirring, dissolving, mixing and/or dispersing simultaneously or separately, with heating if necessary, and, in some cases, adding the inorganic filler to the resulting mixture, followed by mixing, stirring and/or dispersing. In this case, the apparatus or apparatuses for the mixing, stirring, dispersing and/or the like are not particularly limited. Specifically, a grinding machine equipped with a stirrer and a heater, a two-roll mill, a three-roll mill, a ball mill, a continuous extruder, a planetary mixer, a Masscolloider and the like can be used, and these apparatuses may be used in an appropriate combination thereof.

The epoxy resin composition of the present invention obtained in this manner may be carried out by utilizing a conventionally used molding method, for example, transfer molding, compression molding, injection molding and casting. Particularly, compression molding is desirably conducted.

In this case, the molding temperature of the epoxy resin composition is desirably 100 to 180° C. for 45 to 600 seconds, and postcure is desirably conducted at 140 to 180° C. for 1 to 6 hours.

The epoxy resin composition of the present invention makes it possible to reduce warpage in the case of molding on an 8-inch or 12-inch wafer. In addition, the epoxy resin composition is excellent in mechanical strength and insulation properties, and a semiconductor device sealed with the cured product of the epoxy resin composition is excellent in long-term reliability. Besides, defective molding such as flow marks and unfilled areas would not occur even when the epoxy resin composition of the present invention is molded by use of an apparatus and molding conditions similar to those for epoxy resin compositions generally used conventionally as material for transfer molding or compression molding; thus, the epoxy resin composition of the present invention is excellent also in terms of productivity.

The flow marks are white flow traces left in a radial pattern extending from the center toward the outside of a molded product. When the flow marks are generated, there arises a fear of poor external appearance, variability of physical properties of the cured product due to nonuniform dispersion of silica, a lowering in reliability attendant thereon and the like.

The unfilled areas means lacks of resin which are generated in an outer peripheral portion of the wafer. When an unfilled area is generated, a sensor used in conveying the wafer in a later step may erroneously recognize the unfilled area as a notch, leading to a lowering in positioning characteristics.

EXAMPLES

The present invention is described more specifically below by showing Examples and Comparative Examples, but the present invention is not limited to the following Examples. It is noted that in each Example the parts denotes "parts by weight", and % denote "% by weight". In addition, evaluation methods in each Example is shown below.

(A) Liquid Epoxy Resin not Including a Siloxane Bond (1) Epoxy resin A1: bis A type epoxy resin (Epikote 828, manufactured by Japan Epoxy Resins Co., Ltd.)

(2) Epoxy resin A2: naphthalene type epoxy resin (HP4032D, manufactured by DIC Corporation)

(3) Epoxy resin A3: alicyclic type epoxy resin (Celloxide 2021P, manufactured by Daicel Corporation)

(B) Curing Agent (1) Curing agent B1: a mixture of acid anhydrides represented by the following formulas (YH307, manufactured by Japan Epoxy Resins Co., Ltd.)

[Chemical Formula 14]

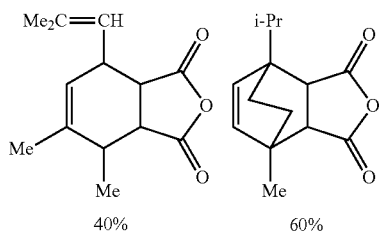

Curing agent B2: a mixture of acid anhydrides represented by the following formulas (MH700, manufactured by New Japan Chemical Co., Ltd.)

[Chemical Formula 15]

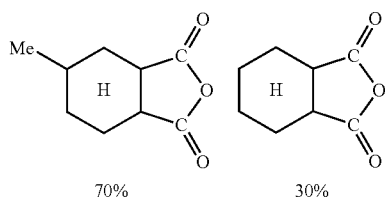

Curing agent B3: 3,3'-diethyl-4,4'-diaminodiphenylmethane (commercial name: KAYAHARD AA, manufactured by Nippon Kayaku Co., Ltd.); amine equivalent: 63.5

(C) Inorganic Filler 100 parts of a base spherical fused silica (manufactured by Admatechs Co., Ltd.; average particle diameter: 5 μm) was subjected to a dry surface treatment with 0.75 part of a silane coupling agent, to prepare the following treated silicas A to G. In Comparative Example 6, the above-mentioned silica in an untreated state was used.

Treated silica A: a silica surface-treated with 3-methacryloxypropyltrimethoxysilane (KBM503, manufactured by Shin-Etsu Chemical Co., Ltd.)

Treated silica B: a silica surface-treated with 3-acryloxypropyltrimethoxysilane (KBM5103, manufactured by Shin-Etsu Chemical Co., Ltd.)

Treated silica C: a silica surface-treated with a silane coupling agent represented by the following formula

[Chemical Formula 16]

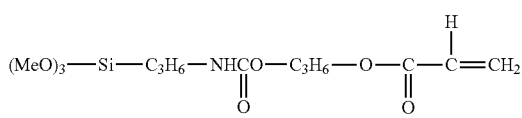

Treated silica D: a silica surface-treated with a silane coupling agent represented by the following formula

[Chemical Formula 17]

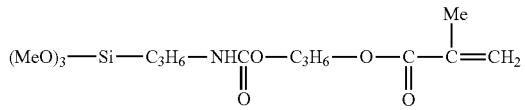

Treated silica E: a silica surface-treated with γ-glycidoxypropyltrimethoxysilane (KBM403, manufactured by Shin-Etsu Chemical Co., Ltd.)

Treated silica F: a silica surface-treated with N-phenyl-3-aminopropyltrimethoxysilane (KBM573, manufactured by Shin-Etsu Chemical Co., Ltd.)

Further, 100 parts of a base spherical fused silica (manufactured by Tatsumori Ltd.; average particle diameter: 12 μm) was subjected to a dry surface treatment with 0.75 part of 3-methacryloxypropyltrimethoxysilane (KBM503, manufactured by Shin-Etsu Chemical Co., Ltd.) to prepare a treated silica G.

(D) Curing accelerator: Novacure HX3088 (manufactured by Asahi Kasei E-materials Corporation)

Other Components (1) Carbon black: Denka Black (manufactured by Denka Co., Ltd.)

(2) Adhesiveness improver: γ-glycidoxypropyltrimethoxysilane (KBM403, manufactured by Shin-Etsu Chemical Co., Ltd.)

(3) Silicone-modified epoxy resin

[Chemical Formula 18]

an addition product of

and $$H-SiO-(SiO)_{100}-Si-H$$

(with CH$_3$ substituents)

TABLE 1

| Formulation | | Example | | | | | |
|---|---|---|---|---|---|---|---|
| (parts by weight) | | 1 | 2 | 3 | 4 | 5 | 6 |
| Epoxy resin A1 | | 7 | 7 | 7 | 7 | 6 | 6 |
| Epoxy resin A2 | | 33 | 33 | 33 | 33 | 30 | 30 |
| Epoxy resin A3 | | 5 | 5 | 5 | 5 | 5 | 5 |
| Curing agent B1 | | | | | | 27 | 27 |
| Curing agent B2 | | 50 | 50 | 50 | 50 | 27 | 27 |
| Inorganic filler | Treated silica A | 700 | | | | 700 | |
| | Treated silica B | | 700 | | | | 700 |

TABLE 1-continued

| Formulation (parts by weight) | Example | | | | | |
|---|---|---|---|---|---|---|
| | 1 | 2 | 3 | 4 | 5 | 6 |
| Treated silica C | | | 700 | | | |
| Treated silica D | | | | 700 | | |
| Treated silica E | | | | | | |
| Treated silica F | | | | | | |
| Treated silica G | | | | | | |
| Curing accelerator | 5 | 5 | 5 | 5 | 5 | 5 |
| Silicone-modified epoxy resin | 5 | 5 | 5 | 5 | 5 | 5 |
| Carbon black | 1 | 1 | 1 | 1 | 1 | 1 |
| Silane coupling agent | 1 | 1 | 1 | 1 | 1 | 1 |
| Resin characteristics and evaluation results | | | | | | |
| Viscosity (Pa·s) | 215 | 195 | 255 | 243 | 295 | 267 |
| Glass transition temperature (°C.) | 145 | 145 | 146 | 146 | 140 | 140 |
| Linear expansion coefficient of up to Tg (ppm/°C.) | 8 | 8 | 8 | 8 | 8 | 8 |
| Linear expansion coefficient of at least Tg (ppm/°C.) | 40 | 40 | 42 | 40 | 45 | 47 |
| Flow mark (present/absent) | absent | absent | absent | absent | absent | absent |
| Unfilled area (present/absent) | present | present | present | present | present | present |
| Polishability (good/NG) | good | good | good | good | good | good |
| Dicing properties (good/NG) | good | good | good | good | good | good |
| Warpage (mm) | <1 | <1 | <1 | <1 | <1 | <1 |
| Peeling or cracking after IR reflow (present/absent) | absent | absent | absent | absent | absent | absent |
| TCT test Initial | OK | OK | OK | OK | OK | OK |
| 250 cycles | OK | OK | OK | OK | OK | OK |
| 500 cycles | OK | OK | OK | OK | OK | OK |
| 750 cycles | OK | OK | OK | OK | OK | OK |

TABLE 2

| Formulation (parts by weight) | Comparative Example | | | | | | |
|---|---|---|---|---|---|---|---|
| | 1 | 2 | 3 | 4 | 5 | 6 | 7 |
| Epoxy resin A1 | 7 | 7 | 7 | 7 | 7 | 70 | 7 |
| Epoxy resin A2 | 33 | 33 | 33 | 33 | 33 | | 33 |
| Epoxy resin A3 | 5 | 5 | 5 | 5 | 5 | | 5 |
| Curing agent B1 | | | | | | | |
| Curing agent B2 | 50 | 50 | 50 | 50 | 50 | | 50 |
| Curing agent B3 | | | | | | 30 | |
| Inorganic filler Non-treated silica | | | | | | | 700 |
| Treated silica A | | | 1,100 | 500 | | 700 | |
| Treated silica B | | | | | | | |
| Treated silica C | | | | | | | |
| Treated silica D | | | | | | | |
| Treated silica E | 700 | | | | | | |
| Treated silica F | | 700 | | | | | |
| Treated silica G | | | | | 700 | | |
| Curing accelerator | 5 | 5 | 5 | 5 | 5 | | |
| Silicone-modified epoxy resin | 5 | 5 | 5 | 5 | 5 | 5 | |
| Carbon black | 1 | 1 | 1 | 1 | 1 | 1 | |
| Silane coupling agent | 1 | 1 | 1 | 1 | 1 | 1 | |
| Resin characteristics and evaluation results | | | | | | | |
| Viscosity (Pa·s) | 565 | 575 | 950 | 65 | 128 | 1,950 | un-measurable due to pasty state |
| Glass transition temperature (°C.) | 145 | 145 | 145 | 145 | 145 | 110 | 142 |
| Linear expansion coefficient of up to Tg (ppm/°C.) | 8 | 8 | 8 | 8 | 8 | 10 | 9 |
| Linear expansion coefficient of at least Tg (ppm/°C.) | 42 | 42 | 42 | 42 | 42 | 50 | 45 |
| Flow mark (present/absent) | present | absent | present | absent | present | absent | present |
| Unfilled area (present/absent) | present | absent | present | absent | present | absent | present |
| Polishability (good/NG) | good | good | good | good | good | good | good |
| Dicing properties (good/NG) | good | good | good | good | good | good | good |
| Warpage (mm) | 5 | 4 | <1 | 23 | <1 | 55 | 30 |

TABLE 2-continued

| Formulation | Comparative Example | | | | | | |
|---|---|---|---|---|---|---|---|
| (parts by weight) | 1 | 2 | 3 | 4 | 5 | 6 | 7 |
| Peeling or cracking after IR reflow (present/absent) | absent | absent | absent | present | present | present | present |
| TCT test Initial | OK | OK | OK | NG | OK | NG | NG |
| 250 cycles | OK | OK | OK | | OK | | |
| 500 cycles | OK | OK | OK | | OK | | |
| 750 cycles | NG | NG | OK | | OK | | |

Viscosity

Viscosity measurement at normal temperature (25° C.) was conducted by use of a Brookfield programmable rheometer type DV-III ultra viscometer (Cone Spindle CP-51, 1.0 rpm).

Glass Transition Temperature and Linear Expansion Coefficient

A specimen measuring 5×5×15 mm was set on a thermal dilatometer (Rigaku TMA8140C), and measurement was conducted from 25° C. to 300° C. at a temperature rise of 5° C./minute and under a load of 19.6 mN. A graph of size variation and temperature was prepared. Arbitrary two temperature points A1 and A2 where a tangent to a size variation-temperature curve was obtained were selected from a range of up to the temperature of an inflection point, and arbitrary two points B1 and B2 where a tangent was obtained were selected from a range of at least the temperature of the inflection point. An intersection of a straight line connecting the points A1 and A2 with a straight line connecting the points B1 and B2 was taken as a glass transition temperature. As is shown in the drawing, the gradient of the straight line A1-A2 was taken as a linear expansion coefficient of up to Tg, while the gradient of the straight line B1-B2 was taken as a linear expansion coefficient of at least Tg.

Measurement of Warpage

Measurement of warpage after compression molding of the liquid resin composition was conducted by use of an 8-inch wafer having a thickness of 725 μm. Setting a resin thickness to 200 μm by a wafer mold (MZ407-1) manufactured by Apic Yamada Corporation, molding at 120° C. was conducted with a compression time of 600 seconds, then complete curing (postcure) was conducted at 150° C. for 1 hour, and warpage was checked.

Presence/Absence of Flow Mark and Unfilled Area

After compression molding of the liquid resin composition at 120° C. for 600 seconds to obtain a resin thickness of 400 μm, complete curing (postcure) was conducted at 150° C. for 1 hour, and then the presence/absence of flow marks and unfilled areas was evaluated by visual inspection of external appearance.

Polishability

After compression molding of the liquid resin composition at 120° C. for 600 seconds to obtain a resin thickness of 400 μm, complete curing (postcure) was conducted at 150° C. for 1 hour, then polishability was checked and evaluated according to the following criteria.

(Disco Automatic Grinder DAG810)
Conditions: Grinding 1.0 μm/second, Spindle speed 4,800 rpm, Stage speed 300 rpm
Good: 600 mesh polishing is possible, and a load current during polishing is stable at up to 8.0 A.
NG: Stable 600 mesh polishing is impossible.

Dicing Properties

After compression molding of the liquid resin composition or pellet-shaped resin composition at 120° C. for 600 seconds to obtain a resin thickness of 400 μm, complete curing (postcure) was conducted at 150° C. for 1 hour, then dicing properties were checked and evaluated according to the following criteria.

(Disco A540)
Good: Upon observation of a section, silicon chipping or peeling at resin-silicon interface is found absent.
NG: Upon observation of a section, silicon chipping or peeling at resin-silicon interface is found present.

Reliability Test

Onto an 8-inch wafer having a thickness of 200 μm, a die bonding material SFX-513M1 (manufactured by Shin-Etsu Chemical Co., Ltd.) was applied by coating (THICK FILM PRINTER TYPE MC212) with a thickness of 20 μm, the wafer was diced in a B stage state to 7 mm square by a dicing machine, and semiconductor chips were prepared.

Next, onto an 8-inch wafer having a thickness of 200 μm, the 220 μm-thick semiconductor chips with the 7 mm-square die bonding material were die bonded by use of a flip chip bonder (Panasonic NM-SB50A) under the conditions of 10 N, 150° C. and 1.0 second, to obtain a 200 μm wafer with the semiconductor chips mounted thereon.

The 200 μm wafer with semiconductor chips was set on a compression molding machine, an appropriate amount of the liquid resin composition was placed thereon, and curing under a maximum molding pressure of 30 MPa to 15 MPa and at 110° C. was conducted for 10 minutes, to obtain a wafer. The amount of the liquid resin composition was controlled in such a manner that the resin thickness after molding would be 400 μm±10 μm. The wafer was heat treated in an oven at 150° C. for 2 hours to achieve postcure, and then the wafer was again diced by a dicing machine to 7.1 mm square, to obtain individualized semiconductor chips with the 400 μm-thick resin mounted thereon.

The individualized semiconductor chips with resin mounted thereon were die-bonded onto a BT substrate with a die bonding material SFX-513S (manufactured by Shin-Etsu Chemical Co., Ltd.) by use of a flip chip bonder (Panasonic NM-SB50A) under the conditions of 10 N, 150° C. and 1.5 seconds, followed by a heat treatment in an oven at 150° C. for 4 hours to achieve postcure, thereby obtaining a BT substrate with semiconductor chips with resin mounted thereon.

Onto the BT substrate with semiconductor chips with resin mounted thereon, a molding compound material was transfer molded (G-LINE PRESS, manufactured by Apic Yamada Corporation), and molding was conducted under the molding conditions of 175° C., 90 seconds, 9 MPa and a thickness of 1.5 mm, followed again by dicing by a dicing machine to 10.0 mm square, to obtain a BT substrate with individualized semiconductor chips with molding compound and resin mounted thereon (semiconductor devices).

The individualized semiconductor devices were subjected to a moisture absorption treatment under the conditions of 85° C. and 85% RH for 168 hours. The thus treated semiconductor devices were passed three times through a reflow oven preset such that the maximum temperature would be 260° C. and the duration of 255 to 260° C. would be 30 seconds±3 seconds, to perform a solder heat resistance test (peel test), and the results were evaluated by visual observation.

TCT (Temperature Cycle Test)

The BT substrate with individualized semiconductor chips with molding compound and resin mounted thereon was put to a cycle test including keeping at −55° C. for 15 minutes and at 125° C. for 15 minutes (automatic) by use of a small-type thermal shock apparatus TSE-11 manufactured by ESPEC Corporation. First, after zero cycle, the peel condition inside the semiconductor chips was checked on a nondestructive basis by use of an ultrasonic flaw detector (QUANTUM350, manufactured by Sonix Corporation) with a 75 MHz probe. Next, the same test was repeatedly conducted after 250 cycles, after 500 cycles, and after 700 cycles. The results are shown in Table 1.

Where the total of peel areas based on the area of the semiconductor chip was less than approximately 5%, the semiconductor chip was evaluated as "Peel absent (OK)" because of minuteness of peel, whereas the semiconductor chip with a peel area of at least 5% was evaluated as "Peel present (NG)."

The invention claimed is:

1. A liquid epoxy resin composition for semiconductor sealing, comprising:
   (A) a liquid epoxy resin that does not include a siloxane bond in its molecule;
   (B) an acid anhydride curing agent;
   (C) a surface-treated spherical inorganic filler which is a spherical inorganic filler having an average particle diameter of 0.1 to 10 μm as measured by a laser diffraction method and serving as an inorganic filler, the surface of the spherical inorganic filler being surface-treated with 0.5 to 2.0 parts by weight of a (meth)acrylic functional silane coupling agent represented by the following formula (1) based on 100 parts by weight of the spherical inorganic filler of component (C), the amount of component (C) being 600 to 1,000 parts by weight based on 100 parts by weight in total of components (A) and (B):

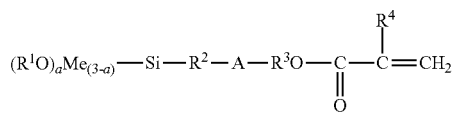
(1)

wherein
the letter a is an integer of 0 to 3,
$R^1$ is a monovalent saturated hydrocarbon group having 1 to 4 carbon atoms,
$R^2$ is a divalent saturated hydrocarbon group having 1 to 10 carbon atoms,
$R^3$ is a single bond or a divalent saturated hydrocarbon group having 1 to 10 carbon atoms,
$R^4$ is a hydrogen atom or a methyl group, and
A is a single bond or any one of groups represented by the following formulas:

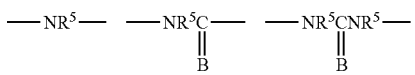

wherein $R^5$ is a monovalent saturated hydrocarbon group having 1 to 4 carbon atoms, and B is O or S

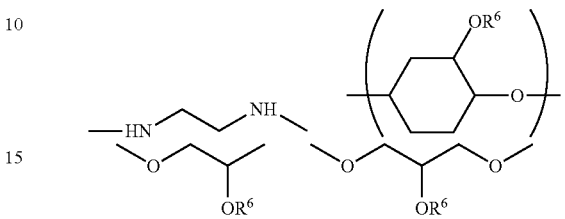

wherein $R^6$ is a monovalent saturated hydrocarbon group having 1 to 4 carbon atoms; and
(D) a curing accelerator.

2. The liquid epoxy resin composition according to claim 1, wherein component (A) is at least one selected from a bisphenol A epoxy resin, a bisphenol F epoxy resin, a naphthalene epoxy resin, an alicyclic epoxy resin and epoxy resins represented by the following formulas

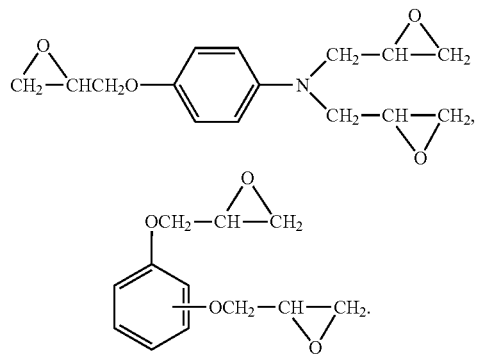

3. The liquid epoxy resin composition for semiconductor sealing according to claim 1 or 2, wherein component (B) is at least one selected from acid anhydrides represented by the following formulas:

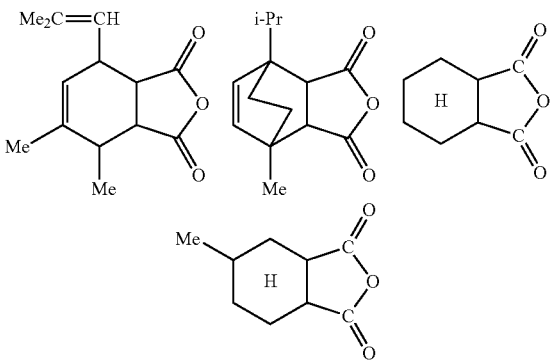

wherein Me represents a methyl group, and i-Pr represents an isopropyl group.

4. The liquid epoxy resin composition according to claim 1, comprising a silicone-modified epoxy resin represented by the following average composition formula (2):

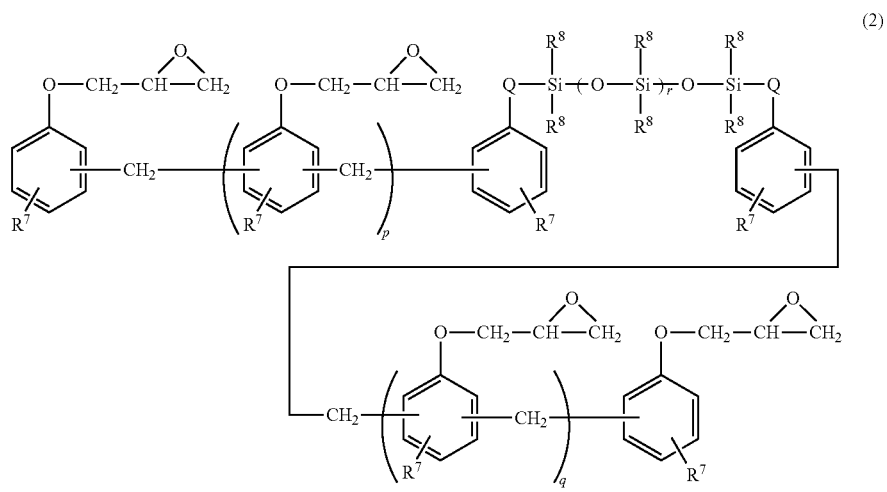

(2)

wherein $R^7$ is a hydrogen atom or an alkyl group having 1 to 4 carbon atoms, $R^8$ is an alkyl group having 1 to 4 carbon atoms, Q is an alkylene group, oxyalkylene group or hydroxyoxyalkylene group having 3 to 6 carbon atoms, letter r is an integer of 4 to 199, letter p is an integer of 1 to 10, and letter q is an integer of 1 to 10 in an amount of 1 to 50 parts by weight based on 100 parts by weight of component (A).

5. The liquid epoxy resin composition according to claim 1, wherein component (D) is at least one selected from a phosphorus compound, a tertiary amine compound and an imidazole compound, and the amount thereof is 0.1 to 15 parts by weight based on 100 parts by weight in total of components (A) and (B).

6. The liquid epoxy resin composition according to claim 5, wherein component (D) is at least one selected from triphenylphosphine, tributylphosphine, tri(p-methylphenyl)phosphine, tri(nonylphenyl)phosphine, triphenylphosphine triphenylborane, tetraphenylphosphine tetraphenylborate, triethylamine, benzyldimethylamine, α-methylbenzyldimethylamine, 1,8-diazabicyclo[5.4.0]undecene-7,2-methylimidazole, 2-phenylimidazole and 2-phenyl-4-methylimidazole.

7. The liquid epoxy resin composition according to claim 1, having a viscosity at 25° C. of 5 to 1,000 Pa·s as measured by the method described in JIS K 7117-1.

8. A semiconductor device sealed with a cured product of the liquid epoxy resin composition according to claim 1.

9. A method of producing a resin-sealed semiconductor device, wherein in collectively sealing a whole body of a silicon wafer or substrate formed with at least one semiconductor element with a cured product of an epoxy resin composition for semiconductor sealing, one side of the silicon wafer or substrate formed with at least one semiconductor element is coated with the liquid epoxy resin composition for semiconductor sealing according to claim 1 under pressure or in a vacuum atmosphere under a reduced pressure, the resin composition is cured by heating to seal the semiconductor elements, thereafter a cured resin layer is polished, and the thus treated silicon wafer or substrate formed with at least one semiconductor element is subjected to dicing, to be divided into individual chips.

10. The method of producing a resin-sealed semiconductor device according to claim 9, which is characterized by using a silicon wafer having a diameter of 12 to 20 inches.

* * * * *